(12) United States Patent
Bu

(10) Patent No.: US 6,653,900 B2
(45) Date of Patent: Nov. 25, 2003

(54) DRIVING METHOD AND RELATED APPARATUS FOR IMPROVING POWER EFFICIENCY OF AN OPERATIONAL TRANSCONDUCTANCE AMPLIFIER

(75) Inventor: Lin-Kai Bu, Tai-Nan (TW)

(73) Assignee: Himax Technologies, Inc., Tainan Hsien (TW)

( * ) Notice: Subject to any disclaimer, the term of this patent is extended or adjusted under 35 U.S.C. 154(b) by 0 days.

(21) Appl. No.: 10/064,209

(22) Filed: Jun. 21, 2002

(65) Prior Publication Data

US 2003/0112071 A1 Jun. 19, 2003

(30) Foreign Application Priority Data

Dec. 19, 2001 (TW) .................................. 90131563 A

(51) Int. Cl.$^7$ ................................................. H03F 3/45
(52) U.S. Cl. ........................ 330/253; 330/257; 330/261
(58) Field of Search ................................. 330/253, 257, 330/261, 288

(56) References Cited

U.S. PATENT DOCUMENTS 5,386,200 A * 1/1995 Limberg ..................... 330/288

* cited by examiner

Primary Examiner—Steven J. Mottola
(74) Attorney, Agent, or Firm—Winston Hsu

(57) ABSTRACT

A driving method for improving power efficiency of an operational transconductance amplifier. The operational transconductance amplifier comprises a first current route and a second current route symmetrical to the first current route. Both of the first current route and the second current route comprise a plurality of transistors. Each of the transistors of the first current route has a smaller width/length ratio than the corresponding transistors of the second current route. The driving method comprises turning on the transistors of the first current route for outputting a reference current so that the second current route outputs a mirror current, which is greater than the reference current, corresponding to the reference current.

25 Claims, 5 Drawing Sheets

DRIVING METHOD AND RELATED APPARATUS FOR IMPROVING POWER EFFICIENCY OF AN OPERATIONAL TRANSCONDUCTANCE AMPLIFIER

BACKGROUND OF INVENTION

1. Field of the Invention

The present invention relates to a driving method of an operational transconductance amplifier, and more particularly, to a driving method for improving power efficiency of an operational transconductance amplifier.

2. Description of the Prior Art

Advantages of the liquid crystal display (LCD) include lighter weight, less electrical consumption, and less radiation contamination. Thus, the LCD has been widely applied to several portable information products such as notebooks, PDAs, etc. The LCD is gradually replacing the CRT monitors of conventional desktop computers. Incident light will produce different polarization or refraction when alignments of these liquid crystal molecules are different. The LCD utilizes the characteristics of the liquid crystal molecules to control the light transmittance and produce gorgeous images.

Please refer to FIG. 1. FIG. 1 is a schematic diagram of a conventional thin film transistor (TFT) liquid crystal display (LCD) monitor 10. The LCD monitor 10 comprises an LCD panel 12, a controller 14, a first driving circuit 16, a second driving circuit 18, a first voltage generator 20, and a second voltage generator 22. The LCD panel 12 comprises two substrates. An LCD layer is filled in the space between these two substrates. One substrate is disposed with a plurality of first data lines 24, a plurality of second data lines 26 which are perpendicular to the first data lines 24, and a plurality of thin film transistors 28. The other substrate is disposed with a common electrode (not shown) for providing a stable voltage (Vcom) by the first voltage generator 20. For convenience, only four thin film transistors 28 are illustrated in FIG. 1. In fact, the thin film transistors 28 are disposed on the LCD panel 12 in a matrix format. That is, each of the thin film transistors 28 is disposed on the intersection of each of the first data lines 24 and each of the second data lines 26. Each first data line 24 corresponds to a column of the LCD panel 12, each second data line 24 corresponds to a row of the LCD panel 12, and each thin film transistor 28 corresponds to a pixel. Additionally, the circuit characteristic formed by the substrates can be deemed an equivalent capacitor 30.

A driving principle for the conventional LCD monitor 10 is described as follows. When the controller 14 receives horizontal synchronization signals or vertical synchronization signals, the controller 14 provides corresponding control signals respectively to the first driving circuit 16 and to the second driving circuit 18. Then the first driving circuit 16 and the second driving circuit 18 provide input signals to the first data lines 24 and the second data lines 26 by determining the control signals. Next, the input signals received by the first data lines 24 and the second data lines 26 change the states of the thin film transistors 28 and the voltage of the equivalent capacitor 30. Finally, the alignment of the liquid crystal molecules and the light transmittance are changed. Therefore, changing the voltage of the input signals provided from the first driving circuit 16 and from the second driving circuit 18 can change the gray level of the corresponding pixel. For example, if the second driving circuit 26 transmits a pulse to the second data lines 18 to turn on the thin film transistor 28, the first driving circuit 16 can transmit signals to the equivalent capacitor 30 through the first data lines 24 and the thin film transistors 28 to control the gray level of a corresponding pixel. Additionally, the signals, transmitted from the first driving circuit 16, of the first data lines 24 are generated from the second voltage generator 22.

Please refer to FIG. 2. FIG. 2 is a schematic diagram illustrating an operational amplifier buffer (op buffer) 40 circuit of the conventional LCD monitor 10 shown in FIG. 1. The op buffer 40 is a class-A driver amplifier. The op buffer 40 is used to drive the LCD monitor 10 so that each pixel on the LCD monitor 10 can reach a predetermined gray level. When a voltage Vin turns on a transistor 41 and a bias voltage Vb turns on transistors 42, 43, a first stage circuit 44 of the op buffer 40 will drive a second stage circuit 45 of the op buffer 40 to generate a corresponding output voltage Vout with current I3. The voltage Vout is used to drive the LCD monitor 10. Because the op buffer 40 is a class-A driver amplifier, it bears a high power efficiency. That is, most power-consumption of the op buffer 40 is used to drive the LCD monitor 10. For example, the sum of currents I1, and I2 is assumed to be 10 uA and the current I3 derived from the op buffer 40 might be 100 uA. That is, the current I3 is much greater than the currents I1, and I2. In other words, most electric power consumed by the op buffer 40 is used for driving the LCD monitor 10.

Concerning a dot inversion driving applied on the LCD monitor 10, a positive driving buffer is used for pulling up voltage of a pixel from a negative polarity to a positive polarity, and a negative driving buffer is used for pushing down voltage of the pixel from the positive polarity to the negative polarity. Therefore, each of the positive driving buffer and the negative driving buffer is only responsible for driving pixels toward a positive or a negative polarity according to the dot inversion driving. The class-A operational amplifier with small bias current is generally adopted to be the required positive or negative driving buffer owing to great power efficiency on driving single polarity. Although the op buffer 40, which is a class-A operational amplifier, bears high power efficiency, yet it still needs a compensating capacitor 46 and an output resistor 47 to control the output slew rate of the op buffer 40. Thus, a bigger layout area and a higher manufacturing cost of the op buffer 40 are inevitable.

Please refer to FIG. 3. FIG. 3 is a schematic diagram illustrating a conventional operational transconductance amplifier (OTA) 50 circuit. A voltage Vin turns on a transistor 51. A bias voltage Vb turns on a transistor 52 and keeps the transistor 52 in a saturation state. Because the voltage at node D is not large enough to turn on a transistor 53 in the beginning, the transistor 53 is cut-off and current I5 equals current I4. Although the OTA 50 bears many advantages such as a smaller size, a simpler structure, and a good slew rate (no extra compensating capacitors or output resistors are necessary), yet the power efficiency of the OTA 50 is not high. As described previously, since the current I5 is equal to the current I6 before the voltage at node D is equal to the voltage Vin to turn on the transistor 53, the power efficiency of the OTA is only 50% (power efficiency= I6/(I5+I6)).

In conclusion, contrary to the op buffer 40, the OTA 50 bears advantages of smaller size and simpler structure. However, the low power efficiency for the OTA 50 prevents it from being applied to the LCD monitor 10.

SUMMARY OF INVENTION

It is therefore a primary objective of the claimed invention to provide an operational transconductance amplifier with simpler structure, smaller size, but higher power efficiency to solve the above-mentioned problems.

The claimed invention provides a driving method for improving power efficiency of an operational transconductance amplifier. The operational transconductance amplifier comprises a first current route and a second current route symmetrical to the first current route. Both of the first current route and the second current route comprise a plurality of transistors. Each of the transistors of the first current route has a smaller width/length ratio than the corresponding transistors of the second current route. The driving method comprises turning on the transistors of the first current route for outputting a reference current so that the second current route outputs a mirror current, which is greater than the reference current, corresponding to the reference current.

It is an advantage of the claimed invention that the operational transconductance amplifier can achieve both high power efficiency and good slew rate by only adjusting the ratio between the W/L ratio of the transistors disposed on the first current route and the W/L ratio of the transistors disposed on the second current route. Therefore, a great amount of current intensity is generated at an output terminal of the operational transconductance amplifier until the voltage level of the output terminal approaches a required value, and high power efficiency is acquired as well.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
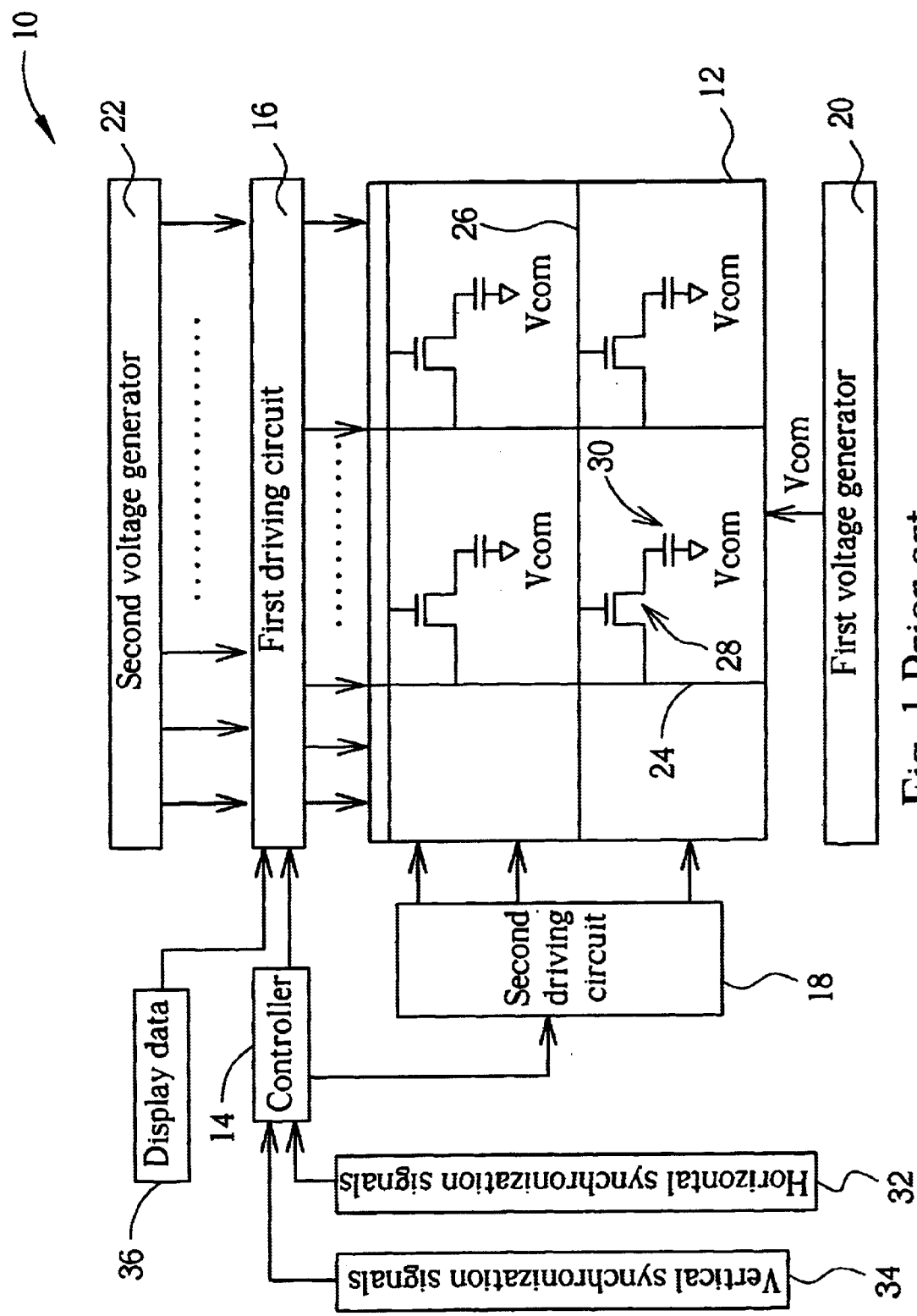
FIG. 1 is a schematic diagram of a prior art TFT LCD monitor.
Figure 2:
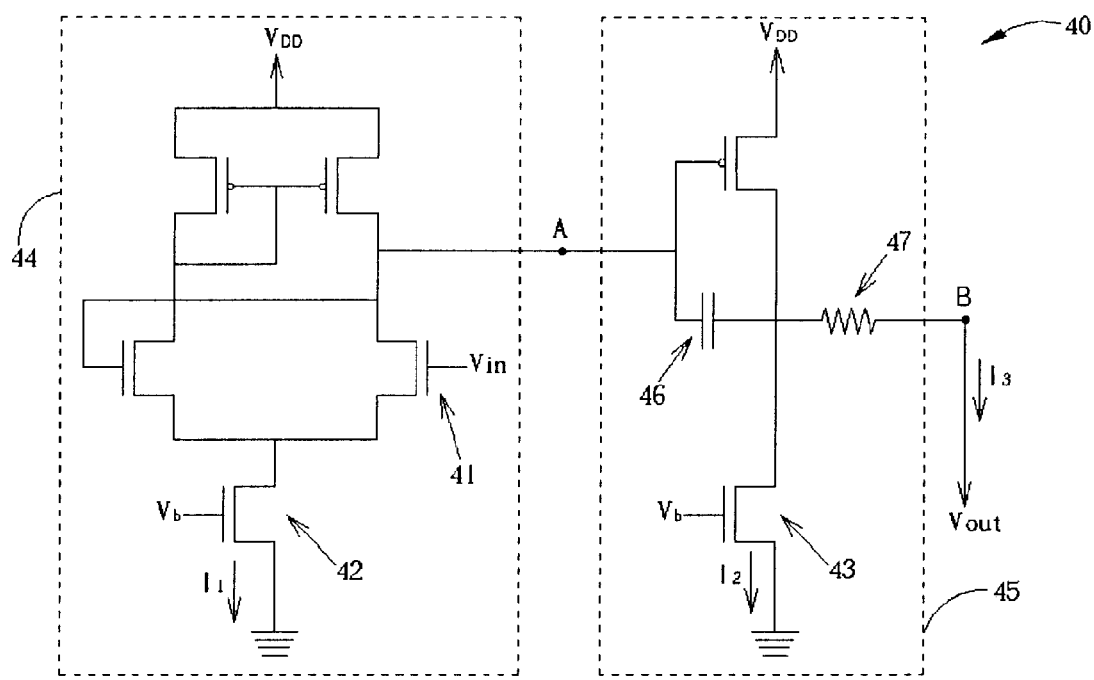
FIG. 2 is a schematic diagram of an op buffer circuit of the prior art TFT LCD monitor.
Figure 3:
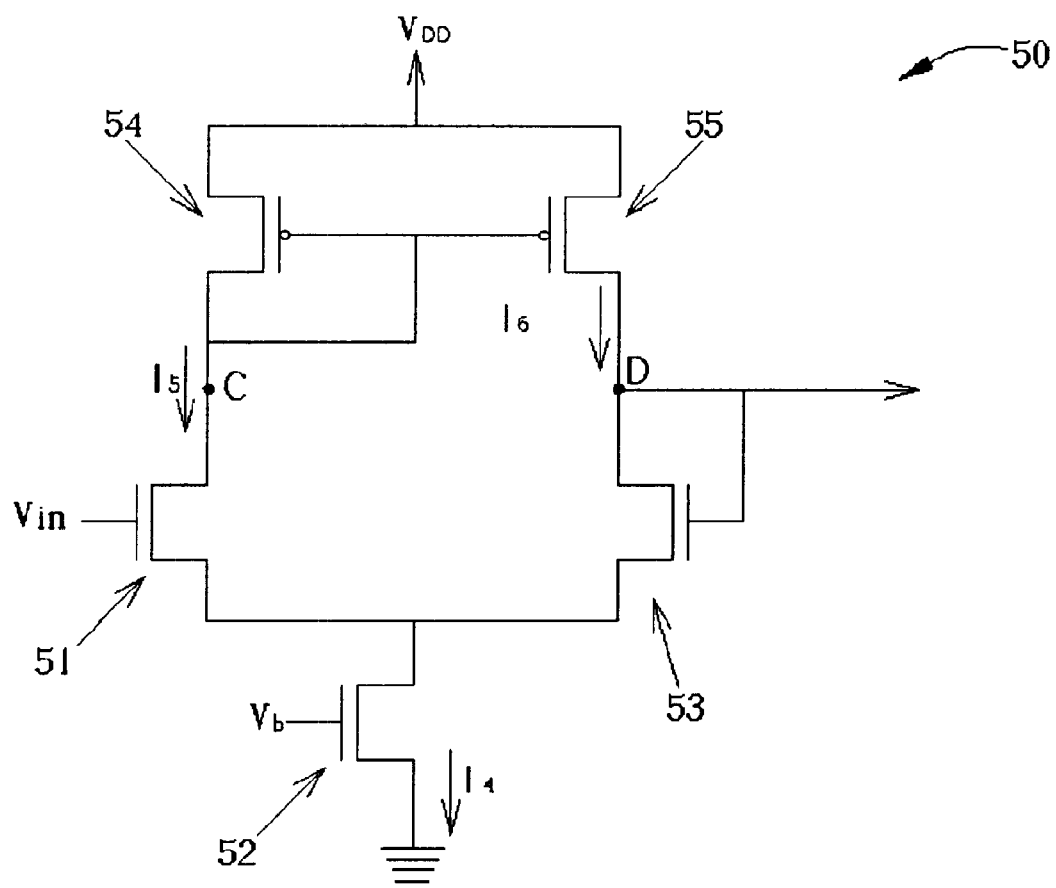
FIG. 3 is a schematic diagram of a prior art operational transconductance amplifier circuit.
Figure 4:
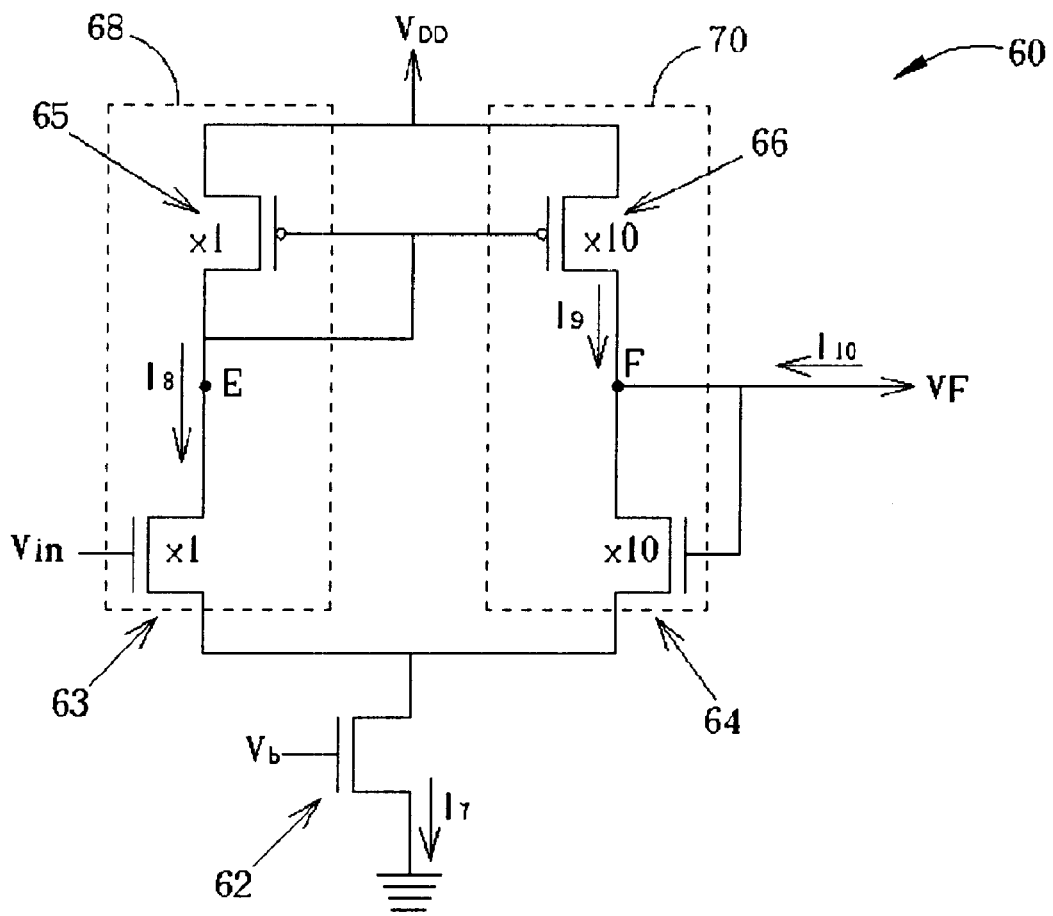
FIG. 4 is a schematic diagram of an operational transconductance amplifier (OTA) circuit according to first embodiment of the present invention.

Please refer to FIG. 4. FIG. 4 is a schematic diagram of an operational transconductance amplifier (OTA) circuit 60 according to a first embodiment of the present invention. The OTA 60 comprises a plurality of transistors, 62, 63, 64, 65, and 66. The transistors 62, 63, and 64 are n-channel metal oxide semiconductor transistors (NMOS transistors); the transistors 65, 66 are p-channel metal oxide semiconductor transistors (PMOS transistors). The transistors 63, 65 form a first current route 68, and the transistors 64, 66 form a second current route 70. The transistors 63, 65 and the transistors 64, 66 respectively form a complementary metal oxide semiconductor transistor (CMOS transistor). In the preferred embodiment, the first current route 68 connects to the second current route 70 through a current mirror formed by the transistors 65, 66, and a width/length ratio (W/L ratio) of the transistors 63, 65 (disposed on the first current route 68) is smaller than that of the transistors 64, 66 (disposed on the second current route 70). When the transistor 62 is maintained in a saturation state, a reference current I7 (corresponding to a bias voltage Vb) will flow through the transistor 62.

In the preferred embodiment, the W/L ratio of the transistors 64, 66 is assumed to be ten times as large as that of the transistors 63, 65. The voltage Vb turns on the transistor 62 and simultaneously generates the reference current I7. In the beginning (initial phase), an input voltage Vin is greater than an output voltage Vf at node F. Because the voltage Vin is temporarily greater than the voltage Vf, the transistor 63 is turned on, and the transistor 64 is kept off. A current I8 passing through the first current route 68 is equal to the reference current I7. In addition, an output current I9 flowing through node F due to the current mirror is ten times as large as the current I8. The reason is that the W/L ratio of the transistor 66 is ten times as large as that of the transistor 65. The current I9, therefore, is also ten times as large as the current I8. At the moment the current I10 is equal to the current I9. The current I10 is provided to a load, such as a liquid crystal cell. The power efficiency of the OTA 60 is (I9/(I8+I9))=91%. For example, if the reference current I7 is 10 uA, the current I8 is 10 uA and the current I9 is 100 uA. In other words, the total current consumption is 110 uA, and the actual current on driving is 100 uA.

When the output voltage Vf finally equals the input voltage Vin, the OTA 60 steps into a stable state (stable phase). Therefore, the output voltage Vf equaling Vin is large enough to turn on the transistor 64. That is, the sum of currents I8, and I9 is nearly equal to the reference current I7. Because the transistor 62 is used for generating a reference circuit I7, the transistor 62 is always maintained in a saturation state, and the reference current I7 will not change no matter if the OTA 60 is stable or not. That is, the output current I9 is still ten times as large as the input current I8, and the sum of the current I8 and the output current I9 still equals the reference current I7 when the OTA 60 reaches a stable state (Vf is equal to Vin for example). If the reference current I7 is 10 uA in the beginning, the input current I8 is 10 uA as well. The output current I9 is 100 uA due to the current mirror and the predetermined W/L ratio relation. When the OTA 60 becomes stable, the reference current I7 is still 10 uA, and the output current I9 is ten times as large as the current I8. However, the sum of the currents I8, and I9 equals I7 (10 uA). Therefore, the output current I9 is 100/11 uA, and the current I8 becomes 10/11 uA eventually. It is noteworthy that the voltage Vf is equal to voltage Vin in the end. That is, a required voltage level (Vin) at node F is obtained because of the conductive transistor 64.

As described previously, the power efficiency of the OTA 60 is measured by the following equation. (I9/(I8+I9))=N/(N+1), wherein N=(W/L ratio of the transistors on the second current route 70)/(W/L ratio of the transistors on the first current route 68). Therefore, a user can acquire the desired power efficiency of the OTA 60 by altering a corresponding N value.

Figure 5:
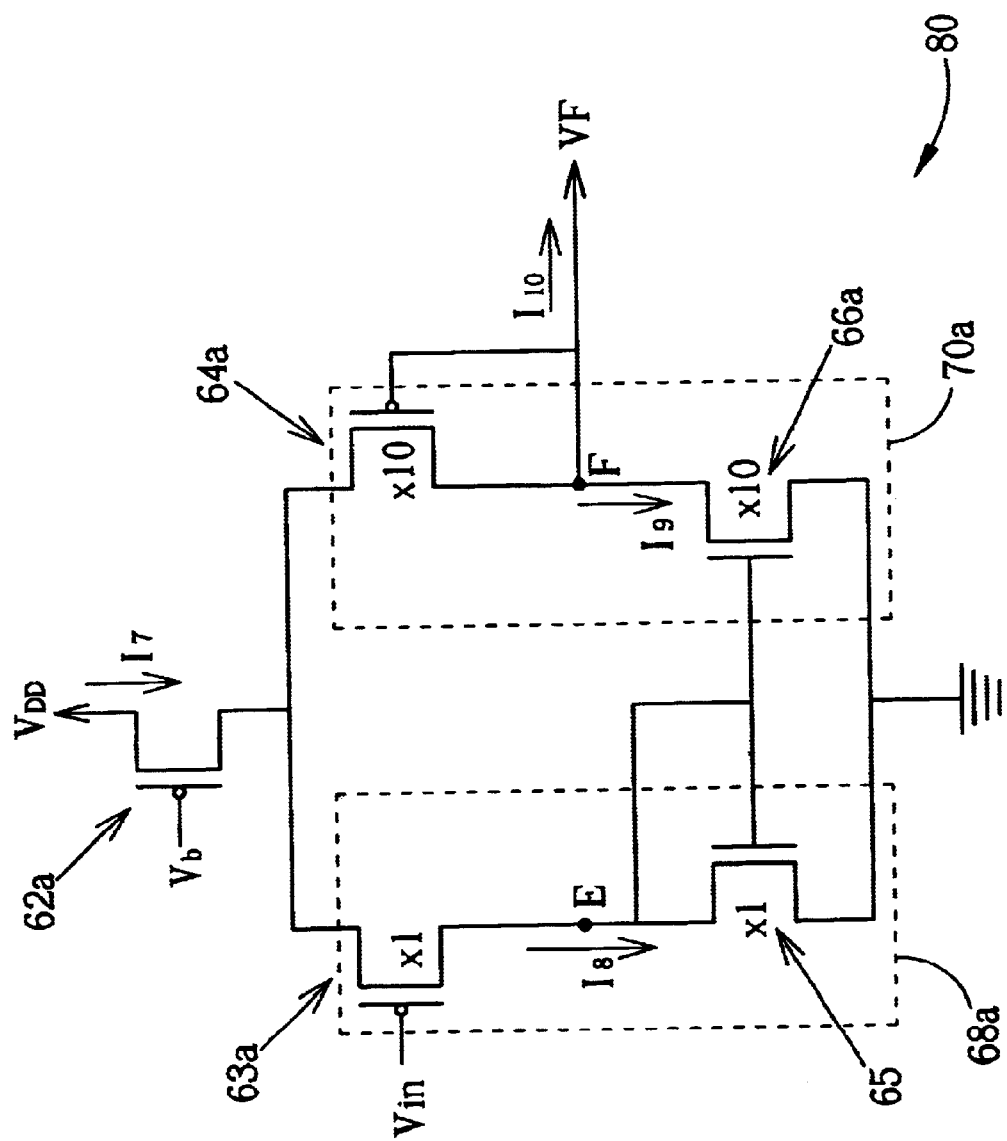
FIG. 5 is a schematic diagram of an operational transconductance amplifier circuit according to the second embodiment of the present invention.

Please refer to FIG. 5, which is a schematic diagram of an operational transconductance amplifier circuit 80 according to a second embodiment of the present invention. The operational transconductance amplifier circuit 80 is similar to the operational transconductance amplifier circuit 60. In the operational transconductance amplifier circuit 60, the transistors 62, 63, and 64 are NMOS transistors, and the transistors 65, and 66 are PMOS transistors. However, the transistors 62a, 63a, and 64a in FIG. 5 are PMOS transistors instead of NMOS in FIG. 4, and the transistors 65a, and 66a in FIG. 5 are NMOS transistors instead of PMOS transistors in FIG. 4. In addition, the transistors 63a and 65a form a first current route 68a, and the transistors 64a and 66a form a second current route 70a as well. In the preferred embodiment, the first current route 68a connects to the second current route 70a through a current mirror formed by the transistors 65a and 66a. The operation of the operational transconductance amplifier circuit 80, therefore, is identical to that of the operational transconductance amplifier circuit 60, and it is not repeated again for simplicity.

In contrast to the prior art, the claimed invention provides a method for improving the power efficiency of the OTA 60 of the LCD monitor 10 by adjusting the W/L ratio of the transistors on current routes. The OTA 60, according to the present invention, does not need any extra output resistance or compensation capacitor to control the output slew rate, so a smaller layout is possible. Because the OTA 60 bears high power efficiency, it is suitable to be used for driving an LCD panel.

Following the detailed description of the present invention above, those skilled in the art will readily observe that numerous modifications and alterations of the device may be made while retaining the teachings of the invention. Accordingly, the above disclosure should be construed as limited only by the metes and bounds of the appended claims.

What is claimed is:

1. A driving method oft operational transconductance amplifier, the operational transconductance amplifier comprising a first current route and a second current route symmetrical to the first current route, both of the first current route and the second current route comprising a plurality of transistor, each of the transistors of the first current route having a smaller width/length ratio than the corresponding transistors of the second current route, and a reference circuit connecting the first current route and the second current route, the reference circuit comprising a transistor; the driving method comprising:

maintaining the transistor of the reference circuit at a saturation status; turning on the transistors of the first current route; and generating a reference current at the reference circuit so that the second current route outputs a mirror current, corresponding to the reference current.

2. The driving method of claim 1 wherein when at least one of the transistors of the second current route is not turned on, the mirror current is larger than the reference current generated by the reference circuit.

3. The driving method of claim 1 wherein when each transistor of the second current route is turned an, the mirror current is less than the reference current generated by the reference circuit.

4. The driving method of claim 1 wherein the operational transconductance amplifier is used for driving a liquid crystal display penal.

5. The driving method of claim 1 wherein each of the first current route and the second current route comprises a complementary metal-oxide semiconductor (CMOS) transistor.

6. The driving method of claim 1 wherein each transistor of the second current route has the width/length ratio five to fifteen times as large as the width/length ratio of each transistor of the first current route.

7. A driving circuit for driving voltage level of an output terminal toward an input voltage, the driving circuit comprising:

a first circuit comprising a plurality of transistors;

a second circuit comprising a plurality of transistors, the second circuit being symmetrical to the first circuit, the transistors of the first circuit having a smaller width/length ratio than the corresponding transistors of the second circuit; and a reference circuit connecting the first circuit and the second circuit for generating a reference current the reference circuit comprising a transistor, which is maintained at status;

wherein the transistors of the first circuit are turned on so that the second circuit outputs a mirror current, corresponding to the reference current.

8. The driving circuit of claim 7 wherein when at least one of the transistors of the second current route is not turned on, the mirror current is larger than the reference current generated by the reference circuit.

9. The driving circuit of claim 7 wherein when each transistor of the second current route is turned on, the mirror current is less than the reference current generated by the reference circuit.

10. The driving circuit of claim 7, wherein the transistors of the first circuit are a p-channel metal-oxide-semiconductor (PMQS) transistor and an n-channel metal-oxide-semiconductor (NMOS) transistor, and the transistors of the second circuit are a PMOS transistor and an NMOS transistor.

11. The driving circuit of claim 10 wherein the transistor of the reference circuit is an NMOS transistor, and the NMOS transistor of the reference circuit has a drain, a gate electrically connected to a first gate voltage, and a source electrically connected to a first reference voltage; the NMOS transistor of the first circuit has a source electrically connected to the drain of the NMOS transistor of the reference circuit, a gate electrically connected to the input voltage, and a drain, and the PMOS transistor of the first circuit has a drain electrically connected to the drain of the NMOS transistor of the first circuit a gate electrically connected to the drain of the PMOS transistor of the first circuit, and a source electrically connected a second reference voltage; the PMOS transistor of the second circuit has a source electrically connected to the second reference voltage, a gate electrically connected to the gate of the PMOS transistor of the first circuit, and a drain electrically connected to the output terminal, and the NMOS transistor of the second circuit has a drain electrically connected to the output terminal, a gate electrically connected to the output terminal, and a source electrically connected to the drain of the NMOS transistor of the reference circuit.

12. The driving circuit of claim 11 wherein when the voltage level at the output terminal is not capable of turning on the NMOS transistor of the second circuit current intensity passing through the output terminal is greater than the reference current, and when to voltage level at the output terminal is capable of turning on the NMOS transistor of the second circuit, current intensity passing through the output terminal is less than the reference current.

13. The driving circuit of claim 12 wherein the first reference voltage is less than the second reference voltage.

14. The driving circuit of claim 10 wherein the transistor of the reference circuit is a PMOS transistor, and the PMOS transistor of the reference circuit has a drain, a gate electrically connected to a first gate voltage, and a source electrically connected to a first reference voltage; the PMOS transistor of the first circuit has a source electrically connected to the drain of the PMOS transistor of the reference circuit, a gate electrically connected to the input voltage, and a drain, and the NMOS transistor of the first circuit has a drain electrically connected to the drain of the PMOS transistor of the first circuit, a gate electrically connected to the drain of the NMOS transistor of the first circuit, and a source electrically connected a second reference voltage; the NMOS transistor of the second circuit has a source electrically connected to the second reference voltage, a gate electrically connected to the gate of the NMOS transistor of the first circuit, and a drain electrically connected to the output terminal, and the PMOS transistor of the second circuit has a drain electrically connected to the output terminal, a gate electrically connected to the output terminal, and a source electrically connected to the drain of the PMQS transistor of the reference circuit.

15. The driving circuit of claim 14, wherein when the voltage level at the output terminal is not capable of turning ante PMOS transistor of the second circuit, current intensity passing through the output terminal is greater than the reference current, and when the voltage level at the output terminal is capable of turning on the PMOS transistor of the second circuit, current intensity passing through the output terminal is less than the reference current.

16. The driving circuit of claim 15 wherein the first reference voltage is greater than the second reference voltage.

17. The driving circuit of claim 7 being an operational transconductance amplifier for driving a liquid crystal display panel.

18. The driving circuit of claim 7 wherein each transistor of the second circuit has the width/length ratio five to fifteen times as large as the width/length ratio of each transistor of the first circuit.

19. A driving method of an operational transconductance amplifier, the operational transconductance amplifier comprising a first current route, a second current route electrically parallel to the first current route and a control transistor serial to both of the first current route and the second current route, both of the first current route and the second current route comprising a plurality of transistors, each of the transistors of the second current route having a larger width/length ratio than the corresponding transistors of the first current route, the second current route having a bypass terminal provided to connect to a load; said driving method comprising the steps of:

turning on the control transistor; and applying an input voltage to one of the transistors of the first current route;

whereby in initial phase, the bypass terminal provides the load a larger output current than a current on the first current route; in stable phase, the bypass terminal provides an output voltage to the load, which is substantially the same as the input voltage.

20. The driving method of claim 19, wherein the operational transconductance amplifier is used for driving a liquid crystal display panel.

21. The driving method of claim 19, wherein each of the first current route and the second currant route comprises a complementary metal-oxide semiconductor (CMOS) transistor.

22. The driving method of claim 19, wherein each transistor of the second current route has the width/length ratio five to fifteen times as large as the width/length ratio of each corresponding transistor of the first current route.

23. An operational transconductance amplifier comprising:

a first current route having an input terminal;

a second current route electrically parallel to said first current route and having an output terminal provided to conned a load, wherein a current on said second current route is a predetermined times larger than a current on said first current route; and a control transistor serial to both of said first current route and said second current path;

thereby while said control transistor is turned on and an input signal is applied to said input terminal, in initial phase said output terminal provides the load a current which is the predetermined times as much as a current on said first current route and in stable phase provides the load the voltage level of the input signal.

24. The operational transconductance amplifier of claim 23, wherein said first current route comprises a serial complementary metal-oxide semiconductor (CMOS) transistor and said second current route comprises a serial CMOS transistor, and each transistor of said second current route has the predetermined times lager width/length ratio than the corresponding transistors of the first current route.

25. The operational transconductance amplifier of claim 23, wherein the load comprises a liquid crystal display cell.

* * * * *